(12) United States Patent
Yoshida et al.

(10) Patent No.: US 9,379,165 B2
(45) Date of Patent: Jun. 28, 2016

(54) SEMICONDUCTOR MEMORY DEVICE

(71) Applicant: KABUSHIKI KAISHA TOSHIBA, Minato-ku (JP)

(72) Inventors: Atsushi Yoshida, Yokkaichi (JP);
Hiroshi Kanno, Yokkaichi (JP);
Takayuki Tsukamoto, Yokkaichi (JP);
Takamasa Okawa, Yokkaichi (JP);
Hideyuki Tabata, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 75 days.

(21) Appl. No.: 14/263,215

(22) Filed: Apr. 28, 2014

(65) Prior Publication Data

US 2015/0179704 A1      Jun. 25, 2015

Related U.S. Application Data

(60) Provisional application No. 61/920,241, filed on Dec. 23, 2013.

(51) Int. Cl.
*H01L 27/10*       (2006.01)
*H01L 27/105*      (2006.01)
*H01L 27/24*       (2006.01)
*H01L 45/00*       (2006.01)
*H01L 23/532*      (2006.01)

(52) U.S. Cl.
CPC ............ *H01L 27/249* (2013.01); *H01L 45/146* (2013.01); *H01L 45/1683* (2013.01); *H01L 23/53295* (2013.01); *H01L 2924/0002* (2013.01)

(58) Field of Classification Search
CPC ... H01L 23/528; H01L 23/532; H01L 21/764; H01L 27/24; H01L 45/00; H01L 21/249; H01L 27/249; H01L 45/1683
See application file for complete search history.

(56) References Cited

U.S. PATENT DOCUMENTS

| 8,822,322 B2* | 9/2014 | Lee ................... H01L 27/11578 257/E21.645 |
| 2011/0233645 A1* | 9/2011 | Iinuma .............. H01L 27/11582 257/324 |
| 2011/0233648 A1 | 9/2011 | Seol et al. |
| 2012/0052674 A1 | 3/2012 | Lee et al. |

(Continued)

FOREIGN PATENT DOCUMENTS

| JP | 2011-211200 | 10/2011 |
| JP | 2012-195424 | 10/2012 |
| JP | 2014-49745 | 3/2014 |

*Primary Examiner* — Jerome Jackson, Jr.
*Assistant Examiner* — Paul Budd
(74) *Attorney, Agent, or Firm* — Oblon, McClelland, Maier & Neustadt, L.L.P.

(57) ABSTRACT

A semiconductor memory device according to an embodiment described below comprises: first lines arranged in a first direction perpendicular to a main surface of a substrate and extending in a second direction crossing the first direction; second lines arranged in the second direction, extending in the first direction, and intersecting the first lines; memory cells disposed at intersections of the first lines and the second lines; and an interlayer insulating film provided between the second lines. The interlayer insulating film has an air gap extending continuously in the first direction so as to intersect at least some of the first lines aligned along the first direction. The interlayer insulating film also includes an insulating film positioned above the air gap and having a curved surface that protrudes toward a direction of the substrate.

20 Claims, 14 Drawing Sheets

(56) References Cited

U.S. PATENT DOCUMENTS

| | | | | |
|---|---|---|---|---|
| 2012/0217568 A1* | 8/2012 | Oda | ............... | H01L 21/28273 257/321 |
| 2012/0235221 A1 | 9/2012 | Ishiduki et al. | | |
| 2012/0267699 A1* | 10/2012 | Kiyotoshi | ......... | H01L 27/11524 257/319 |
| 2013/0032873 A1* | 2/2013 | Kiyotoshi | ......... | H01L 27/11582 257/324 |
| 2014/0061577 A1 | 3/2014 | Kanno et al. | | |

* cited by examiner

SEMICONDUCTOR MEMORY DEVICE

CROSS REFERENCE TO RELATED APPLICATIONS

This application is based on and claims the benefit of priority from prior U.S. prior provisional Patent Application No. 61/920,241, filed on Dec. 23, 2013, the entire contents of which are incorporated herein by reference.

FIELD

Embodiments relate to a semiconductor memory device.

BACKGROUND

In recent years, ReRAM (Resistive RAM) having a variable resistance element as memory, has been proposed. Moreover, ReRAM has a structure where the variable resistance element is provided between a sidewall of a word line extending parallel to a substrate and a sidewall of a bit line extending perpendicularly to the substrate, because it enables an even higher degree of integration of a memory cell array to be achieved. However, in a memory cell array of such a structure, an embedding defect of an interlayer insulating film may cause a pattern defect, and so on, and it leads to lowering of reliability of the semiconductor memory device.

DETAILED DESCRIPTION

A semiconductor memory device according to an embodiment described below comprises: a plurality of first lines arranged in a first direction perpendicular to a substrate and configured to extend in a second direction parallel to the substrate; a plurality of second lines arranged in the second direction and configured to extend in the first direction, the plurality of second lines intersecting the plurality of first lines; a plurality of memory cells disposed at intersections of the plurality of first lines and the plurality of second lines; and an interlayer insulating film provided between the second lines. The interlayer insulating film comprises an air gap extending continuously in the first direction so as to intersect at least some of the plurality of first lines aligned along the first direction, and the interlayer insulating film comprises, above the air gap, an insulating film having a curved surface that protrudes toward a direction of the substrate.

Next, various kinds of embodiments will be described in detail with reference to the drawings.

[First Embodiment]
[Configuration]

First, an overall configuration of a semiconductor memory device according to a first embodiment will be described.

Figure 1:
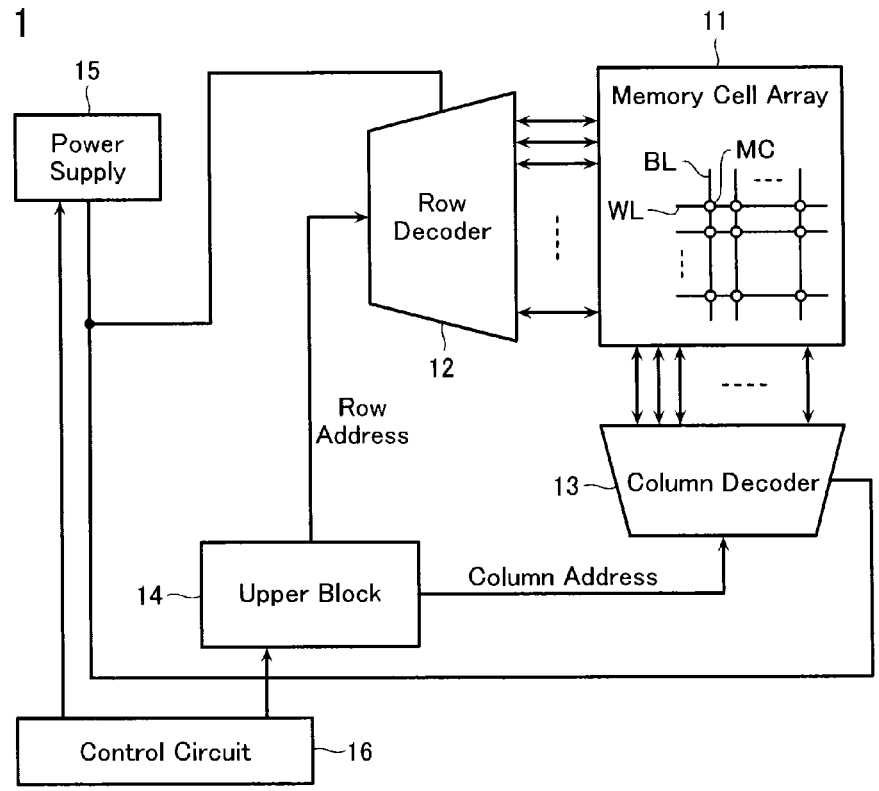
FIG. 1 is an example of a block diagram of a semiconductor memory device according to a first embodiment.

FIG. 1 is an example of a block diagram of the semiconductor memory device according to the first embodiment. As shown in FIG. 1, the semiconductor memory device includes a memory cell array 11, a row decoder 12, a column decoder 13, an upper block 14, a power supply 15, and a control circuit 16.

The memory cell array 11 includes a plurality of word lines WL and bit lines BL that intersect each other, and memory cells MC disposed one at each of intersections of these word lines WL and bit lines BL. The row decoder selects the word line WL during access (data erase/write/read). The column decoder 13 selects the bit line BL during access, and includes a driver that controls an access operation.

The upper block 14 selects the memory cell MC which is to be an access target in the memory cell array 11. The upper block 14 provides a row address and a column address to, respectively, the row decoder 12 and the column decoder 13. The power supply 15 generates certain combinations of voltages corresponding to each of operations of data erase/write/read, and supplies these combinations of voltages to the row decoder 12 and the column decoder 13. The control circuit 16 performs control of, for example, sending the addresses to the upper block 14, and, moreover, performs control of the power supply 15, based on a command from external.

Figure 2:
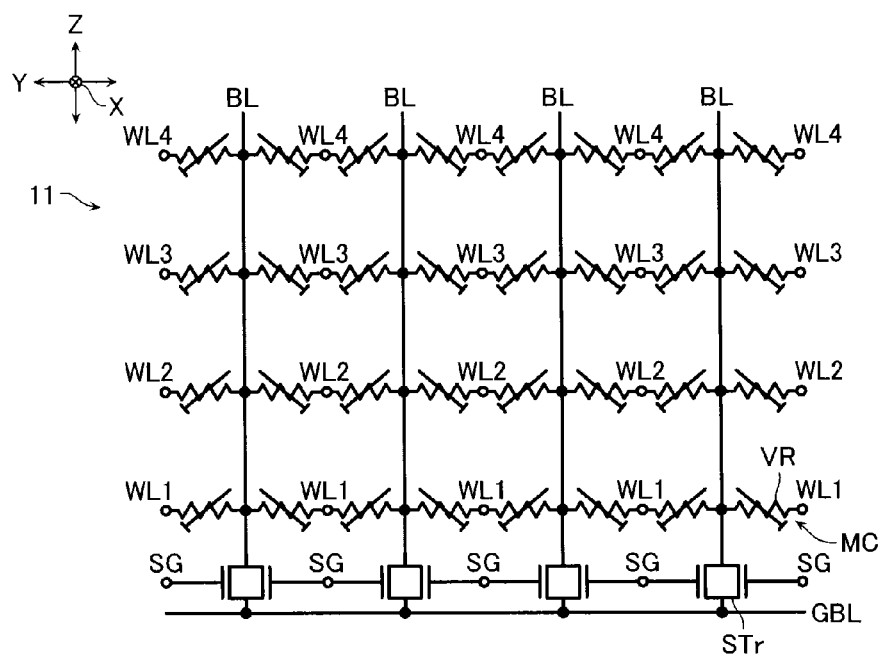
FIG. 2 is an example of a circuit diagram of a memory cell array 11 according to the first embodiment.
Figure 3:
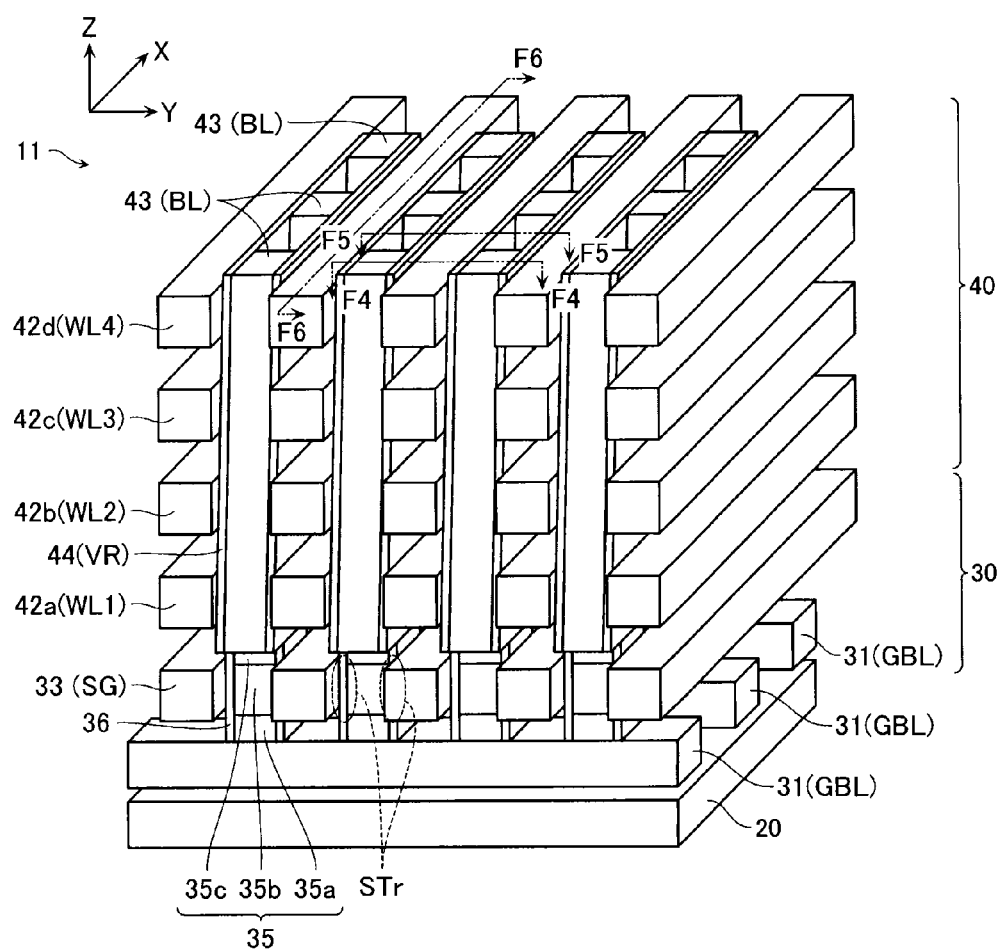
FIG. 3 is an example of a perspective view showing a stacked structure of the memory cell array 11 according to the first embodiment.

Next, the memory cell array 11 according to the first embodiment will be described in detail with reference to FIGS. 2 and 3. FIG. 2 is an example of a circuit diagram of the memory cell array 11. FIG. 3 is an example of a perspective view showing a stacked structure of the memory cell array 11. Note that in FIG. 2, an X direction, a Y direction, and a Z direction are orthogonal to each other, and the X direction is a direction perpendicular to a plane of paper. In addition, a structure shown in FIG. 2 is provided repeatedly in the X direction.

As shown in FIG. 2, the memory cell array 11 includes a select transistor STr, a global bit line GBL, and a select gate line SG, in addition to the above-mentioned word line WL, bit line BL, and memory cell MC.

As shown in FIGS. 2 and 3, word lines WL1 to WL4 are arranged in the Z direction with a certain pitch, and extend in the X direction. The bit lines BL are arranged in a matrix in the X direction and the Y direction, and extend in the Z direction. The memory cells MC are disposed at places where these word lines WL and bit lines BL intersect. Therefore, the memory cells MC are arranged in a three-dimensional matrix in the X, Y, and Z directions.

As shown in FIG. 2, the memory cell MC includes a variable resistance element VR. A resistance value of the variable resistance element VR changes between a high-resistance state and a low-resistance state based on an applied voltage, whereby the memory cell MC stores data in a nonvolatile manner based on that resistance value. The variable resistance element VR changes from the high-resistance state (reset state) to the low-resistance state (set state) by a setting operation that applies a certain constant voltage or more to both terminals of the variable resistance element VR, and changes from the low-resistance state (set state) to the high-resistance state (reset state) by a resetting operation that applies a certain constant voltage or more to both terminals of the variable resistance element VR. In addition, the variable resistance element VR is in a state where its resistance state is not easily changed, and is in a high-resistance state, immediately after it is manufactured. Accordingly, a forming operation is executed where a high voltage greater than or equal to that of the setting operation and the resetting operation is applied to both terminals of the variable resistance element VR. As a result of this forming operation, a region where a current easily flows (filament path) is formed locally in the variable resistance element VR, whereby the variable resistance element VR can have its resistance state changed easily, and achieves a state of being operable as a storage element.

As shown in FIG. 2, the select transistor STr is provided between the global bit line GBL and one end of the bit line BL. The global bit lines GBL are aligned with a certain pitch in the X direction, and extend in the Y direction. One global bit line GBL is commonly connected to one ends of a plurality of select transistors STr arranged in a line in the Y direction.

In addition, gate electrodes disposed between two select transistors STr arranged adjacently in the Y direction can be commonly connected. The select gate lines SG are aligned with a certain pitch in the Y direction, and extend in the X direction. One select gate line SG is commonly connected to gates of a plurality of the select transistors STr arranged in a line in the X direction. Note that it is also possible to separate gate electrodes between two select transistors STr arranged adjacently in the Y direction and thereby operate each of the two select transistors STr independently.

Figure 4:
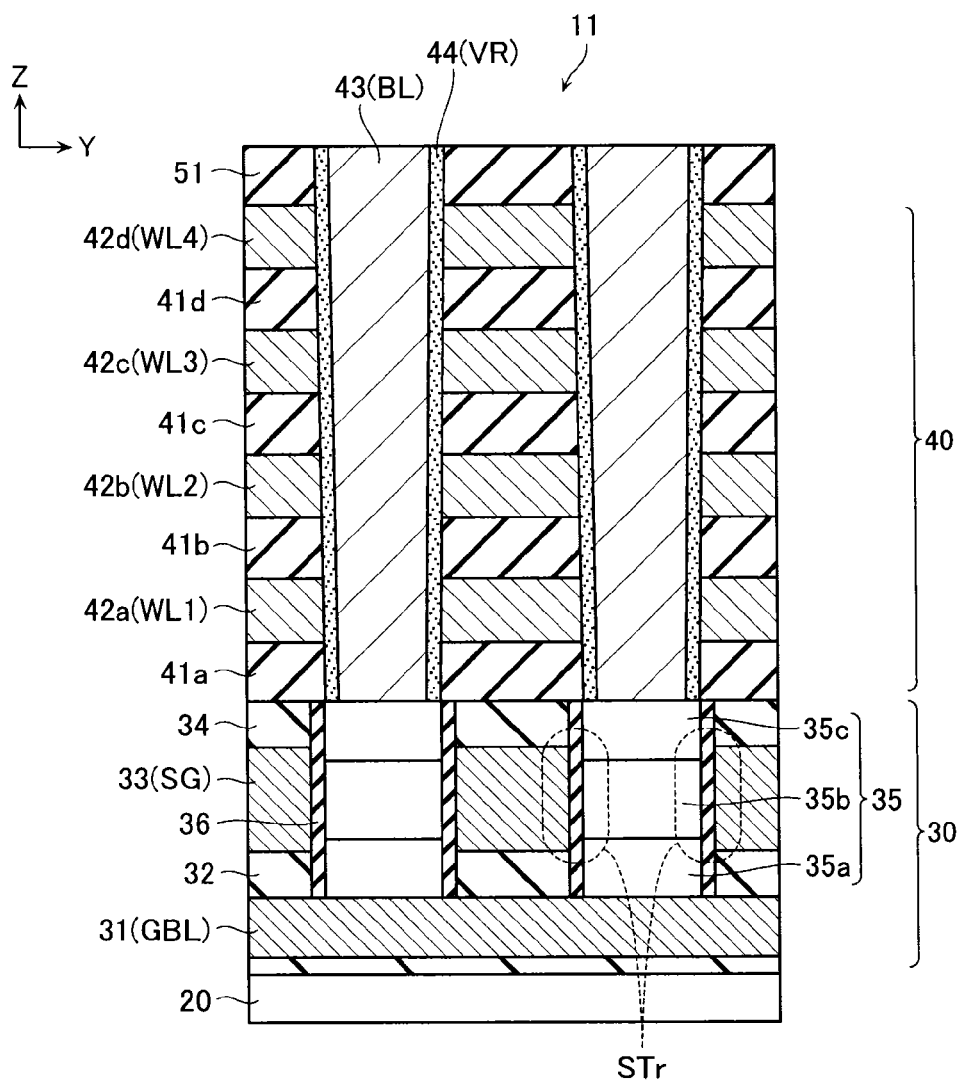
FIG. 4 is an example of a cross-sectional view taken along the line F4-F4 of FIG. 3.
Figure 5:
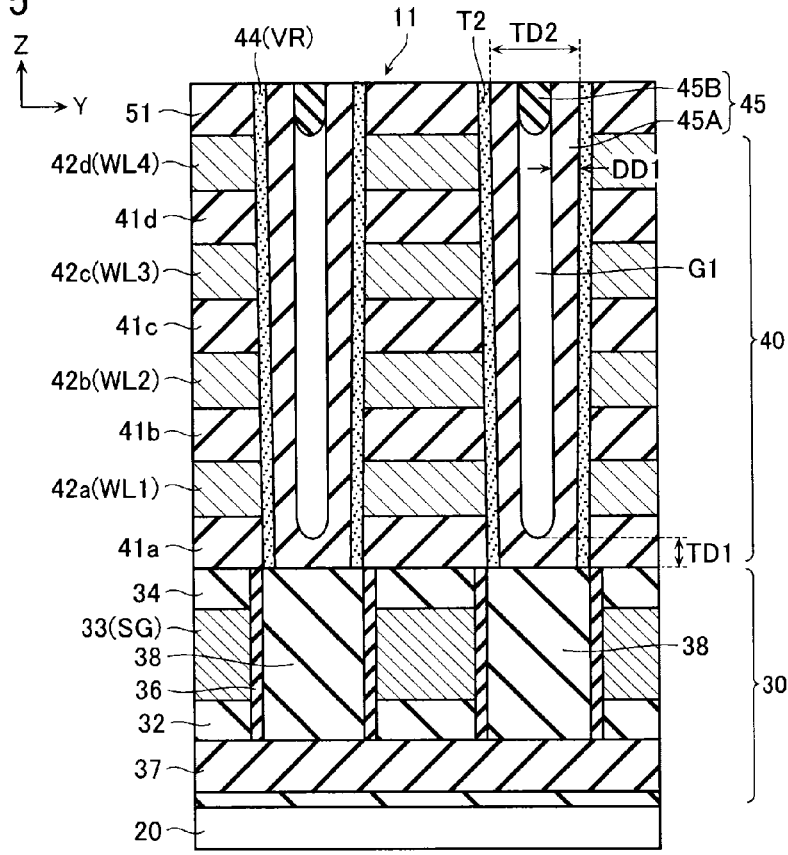
FIG. 5 is an example of a cross-sectional view taken along the line F5-F5 of FIG. 3.
Figure 6:
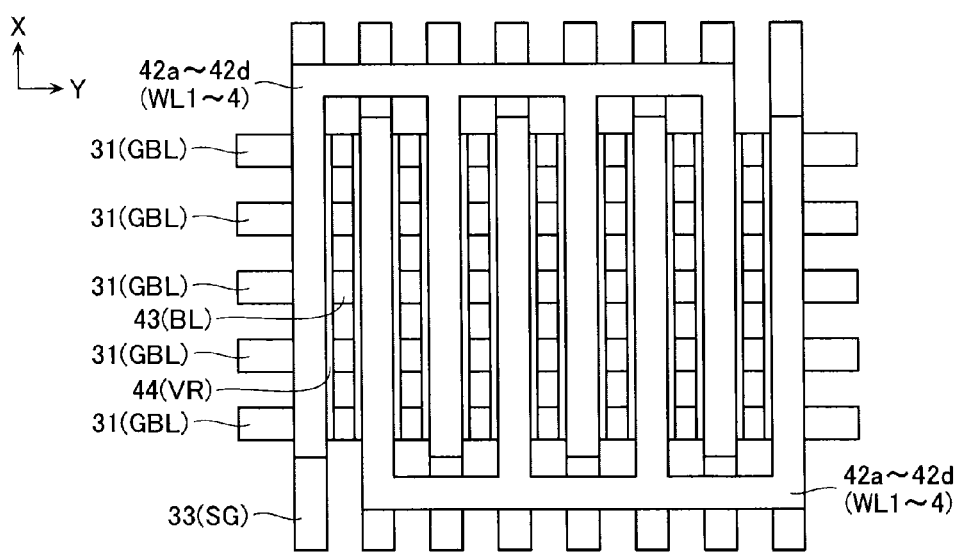
FIG. 6 is an example of a top view of FIG. 3.

Next, a stacked structure of the memory cell array 11 according to the first embodiment will be described with reference to FIGS. 3, 4, and 5. FIG. 4 is an example of a cross-sectional view of an F4-F4 plane of FIG. 3, FIG. 5 is an example of a cross-sectional view of an F5-F5 plane of FIG. 3, and FIG. 6 is an example of a top view of FIG. 3. Note that in FIGS. 3 and 6, illustration of an interlayer insulating film is omitted.

As shown in FIGS. 3 and 5, the memory cell array 11 includes a select transistor layer 30 and a memory layer 40 that are stacked on a substrate 20. The select transistor layer 30 functions as the select transistor STr, and the memory layer 40 functions as the memory cell MC.

As shown in FIGS. 3 and 4, the select transistor layer 30 includes a conductive layer 31, an interlayer insulating film 32, a conductive layer 33, and an interlayer insulating film 34. These conductive layer 31, interlayer insulating film 32, conductive layer 33, and interlayer insulating film 34 are stacked in the Z direction perpendicular to the substrate 20. The conductive layer 31 functions as the global bit line GBL, and the conductive layer 33 functions as the select gate line SG and as the gate of the select transistor STr.

The conductive layers 31 are aligned with a certain pitch in the X direction parallel to the substrate 20, and have a striped shape extending in the Y direction (refer to FIG. 6). As will be described later, an interlayer insulating film 37 is formed between a plurality of the conductive layers 31, although illustration of this in FIG. 3 is omitted.

The interlayer insulating film 32 is formed so as to cover an upper surface of the conductive layer 31, and has a role of electrically insulating between the conductive layer 31 and the select gate line SG (conductive layer 33). The conductive layers 33 are aligned with a certain pitch in the Y direction, and are formed in a striped shape extending in the X direction (refer to FIG. 6). The interlayer insulating film 34 is deposited so as to cover a side surface and an upper surface of the conductive layer 33. For example, the conductive layers 31 and 33 are configured by polysilicon. The interlayer insulating films 32 and 34 are configured by silicon oxide ($SiO_2$).

In addition, as shown in FIGS. 3 and 4, the select transistor layer 30 includes, for example, a column-shaped semiconductor layer 35 and a gate insulating layer 36. The semiconductor layer 35 functions as a body (channel) of the select transistor STr, and the gate insulating layer 36 functions as a gate insulating film of the select transistor STr.

The semiconductor layers 35 are disposed in a matrix in the X and Y directions, and extend in the Z direction. In addition, the semiconductor layer 35 contacts the upper surface of the conductive layer 31, and contacts a side surface in the Y direction of the conductive layer via the gate insulating layer 36. Moreover, the semiconductor layer 35 includes, stacked from below to above, an N+ type semiconductor layer 35$a$, a P+ type semiconductor layer 35$b$, and an N+ type semiconductor layer 35$c$.

As shown in FIGS. 3 and 4, the N+ type semiconductor layer 35$a$ contacts the interlayer insulating film 32 via the gate insulating layer 36 at a side surface in the Y direction of the N+ type semiconductor layer 35$a$. The P+ type semiconductor layer 35$b$ contacts a side surface of the conductive layer 33 via the gate insulating layer 36 at a side surface in the Y direction of the P+ type semiconductor layer 35$b$. The N+ type semiconductor layer 35$c$ contacts the interlayer insulating film 34 via the gate insulating layer 36 at a side surface in the Y direction of the N+ type semiconductor layer 35$c$. The N+ type semiconductor layers 35$a$ and 35$c$ are configured by polysilicon doped with an N+ type impurity, and the P+ type semiconductor layer 35$b$ is configured by polysilicon doped with a P+ type impurity. The gate insulating layer 36 is configured by, for example, silicon oxide ($SiO_2$).

As shown in FIGS. 3 and 4, the memory layer 40 includes interlayer insulating films 41$a$ to 41$d$ and conductive layers 42$a$ to 42$d$ which are stacked alternately in the Z direction. The conductive layers 42$a$ to 42$d$ function as the word lines WL1 to WL4, respectively. The conductive layers 42$a$ to 42$d$, when viewed from the Z direction, each include a pair of comb shapes facing each other in the X direction (refer to FIG. 6). The interlayer insulating films 41$a$ to 41$d$ are configured by, for example, silicon oxide ($SiO_2$), and the conductive layers 42$a$ to 42$d$ are configured by, for example, polysilicon.

In addition, as shown in FIGS. 3 and 4, the memory layer 40 includes, for example, a column-shaped conductive layer 43 and a variable resistance layer 44. The conductive layer 43 functions as the bit line BL. The variable resistance layer 44 functions as the variable resistance element VR.

The conductive layers 43 are disposed in a matrix in the X and Y directions, contact an upper surface of the semiconductor layer 35 at a lower end of the conductive layer 43, and the conductive layers 43 have a columnar shape extending in the Z direction. An interlayer insulating film 45 is formed between the semiconductor layers 43 aligned in the X direction, although illustration of this in FIG. 3 is omitted. A structure of this interlayer insulating film 45 will be described later using FIG. 5. In some cases, the conductive layer 43 of this embodiment has an inverse tapered shape in which a width of an upper end portion thereof is larger and a width of a lower end portion thereof is smaller, in a ZY cross-section along the Z direction and the Y direction. On the other hand, the conductive layer 43 may have a forward tapered shape in which a width of an upper end portion thereof is smaller and a width of a lower end portion thereof is larger, in an XZ cross-section along the Z direction and the X direction.

The variable resistance layer 44 is provided between a side surface in the Y direction of the conductive layer 43 and side surfaces in the Y direction of the interlayer insulating films 41a to 41d. In addition, the variable resistance layer 44 is provided between the side surface in the Y direction of the conductive layer 43 and side surfaces in the Y direction of the conductive layers 42a to 42d. The conductive layer 43 is configured by, for example, polysilicon, and the variable resistance layer 44 is configured by, for example, a metal oxide (for example, $HfO_x$, $Al_2O_x$, $TiO_x$, $NiO_x$, $WO_x$, $Ta_2O_x$, and so on).

As previously mentioned, FIG. 5 shows an F5-F5 cross-section of FIG. 3. In this F5-F5 cross-section, the conductive layer 31, the semiconductor layer 35, and the conductive layer 43 are not present, and instead, the interlayer insulating film 37, an interlayer insulating film 38, and the interlayer insulating film 45 are formed. The interlayer insulating films 37, 38, and 45 are configured by, for example, silicon oxide ($SiO_2$).

As shown in FIG. 5, the interlayer insulating film comprises a first interlayer insulating film 45A formed along a sidewall of a trench T2 formed between the semiconductor layers 43 aligned in the X direction. Moreover, the variable resistance layer 44 may be formed between the first interlayer insulating film 45A and the semiconductor layer 43.

Furthermore, an air gap G1 is formed in the first interlayer insulating film 45A. An upper end of the air gap G1 is in an upper portion of the trench T2, and the air gap G1 is formed continuously from the upper end to a lower end thereof. That is, the air gap G1 is substantively continuous without being blocked, from the upper end to the lower end thereof. Positions of the upper end and the lower end are not limited, and need only be positions that do not substantively cause a problem of voids which will be described later. In other words, the air gap G1 need only extend in the Z direction so as to intersect at least some of the plurality of word lines (conductive layers 42a to 42d) aligned along the Z direction. In FIG. 5, the air gap G1 extends in the Z direction so as to intersect all four of the word lines (conductive layers 42a to 42d).

The lower end of the air gap G1 is higher than an upper surface of the interlayer insulating film 38 (a lower surface of the interlayer insulating film 45A, or a lower surface of the semiconductor layer 43) by an amount of a film thickness DD1 of the interlayer insulating film 45A (a thickness in the Y direction of a side surface of the trench T2), or is higher than the upper surface of the interlayer insulating film 38 by even slightly more than the film thickness DD1. That is, a distance TD1 from a lower end of the trench T2 to the lower end of the air gap G1 could be said to be smaller than half of a width TD2 of an upper surface of the trench T2 (here, a width TD2 between the variable resistance layers 44 formed on a side surface of the trench T2).

An upper end portion of this first interlayer insulating film 45A is blocked by a second interlayer insulating film 45B. This second interlayer insulating film 45B configures a cap portion so as to block an upper portion of the air gap G1. The second interlayer insulating film 45B is formed by a different process from the first interlayer insulating film 45A, and a lower end portion of the second interlayer insulating film 45B has a curved surface that protrudes to a substrate 20 side (the second interlayer insulating film 45B could also be said to have a downwardly convex shape). Now, blocking the upper portion of the air gap G1 by the second interlayer insulating film 45B can increase mechanical strength of the interlayer insulating film 45, and makes it possible to prevent collapse of the memory layer 40. Note that in the present embodiment, the interlayer insulating film 45 may include only the first interlayer insulating film 45A including the air gap G1 and may be formed along the sidewall of the trench T2, while the second interlayer insulating film 45B may be omitted. However, from a viewpoint of suppressing contamination in the air gap G1, it is preferable to form the second interlayer insulating film 45B as a cap portion.

Next, a manufacturing method of the semiconductor memory device according to the first embodiment will be described with reference to FIGS. 7 to 12. FIGS. 7 to 12 are each an example of a perspective view showing a manufacturing method of the memory cell array 11. Note that the manufacturing method described below indicates only a manufacturing method of the memory layer 40. Manufacturing of the select transistor layer 30 can be performed by the likes of an ordinary CVD method, lithography method, and dry etching, hence a description thereof will be omitted.

Figure 7:
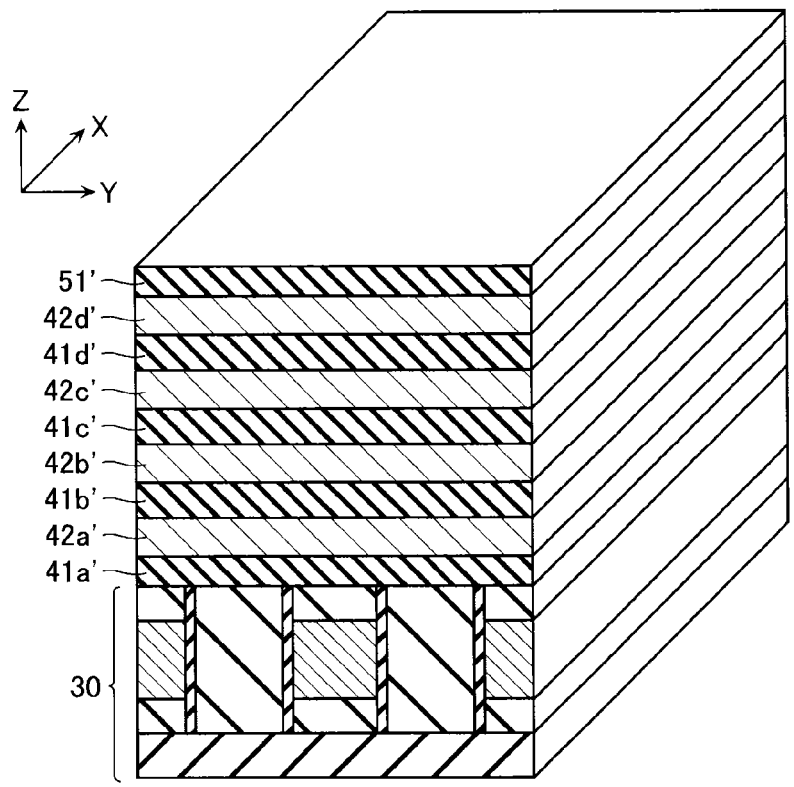
FIG. 7 is an example of a perspective view showing a manufacturing method of the memory cell array 11 according to the first embodiment.

As shown in FIG. 7, silicon oxide ($SiO_2$) and polysilicon (Si) are stacked alternately on an upper surface of the select transistor layer 30 to form interlayer insulating layers 41a' to 41d' and conductive layers 42a' to 42d' that extend in a plate-like shape in the X direction and the Y direction. In addition, a protective layer 51' is formed on the conductive layer 42d'.

Figure 8:
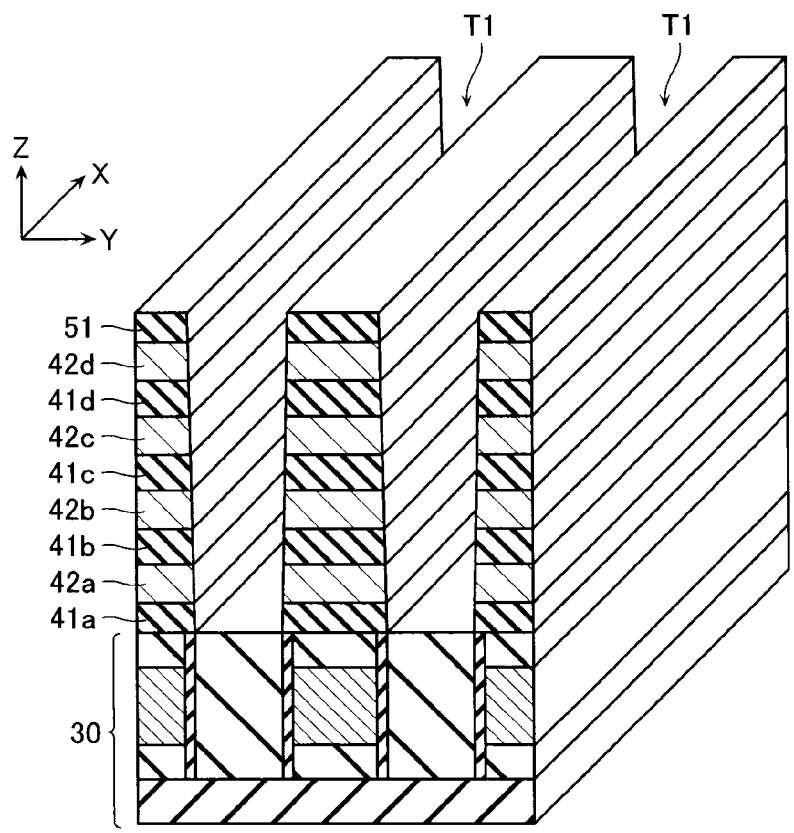
FIG. 8 is an example of a perspective view showing the manufacturing method of the memory cell array 11 according to the first embodiment.

Next, as shown in FIG. 8, a trench T1 that penetrates the interlayer insulating layers 41a' to 41d', the conductive layers 42a' to 42d', and the protective layer 51', is formed. The trenches T1 are arranged with a certain pitch in the Y direction, and are formed so as to extend in the X direction. This trench T1 causes the interlayer insulating layers 41a' to 41d', the conductive layers 42a' to 42d', and the protective layer 51' to be come the interlayer insulating layers 41a to 41d, the conductive layers 42a to 42d, and the protective layer 51 that extend in a striped shape in the X direction.

Figure 9:
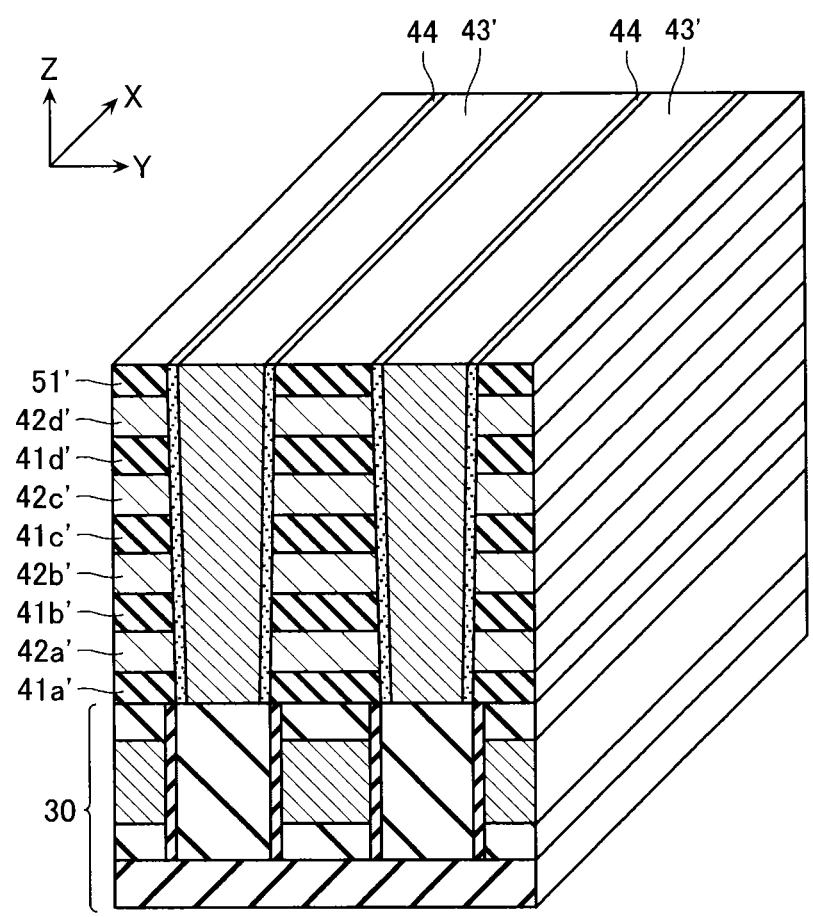
FIG. 9 is an example of a perspective view showing the manufacturing method of the memory cell array 11 according to the first embodiment.

Next, as shown in FIG. 9, the variable resistance layer 44 is formed on a side surface of the trench T1. Now, the variable resistance layer 44 is formed on the side surface of the trench T1 and then only the variable resistance layer 44 formed on a bottom surface of the trench T1 is removed. As a result, the variable resistance layer 44 is formed in a planar manner on all side surfaces of the trench T1. It is sufficient for a film thickness of the variable resistance layer 44 to be about several nm. Moreover, a semiconductor layer 43' is formed so as to fill the trench T1. For example, the variable resistance layer 44 is formed by depositing a metal oxide by atomic layer deposition (ALD).

Figure 10A:
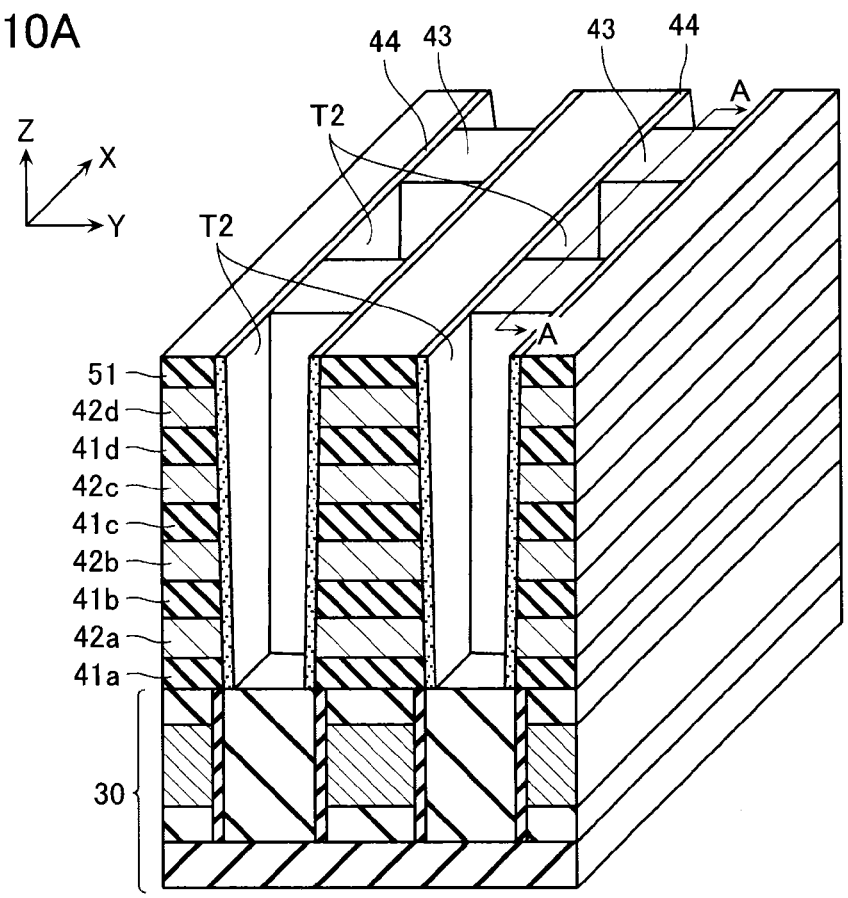
FIGS. 10A and 10B are examples of a perspective view and a cross-sectional view showing the manufacturing method of the memory cell array 11 according to the first embodiment.
Figure 10B:
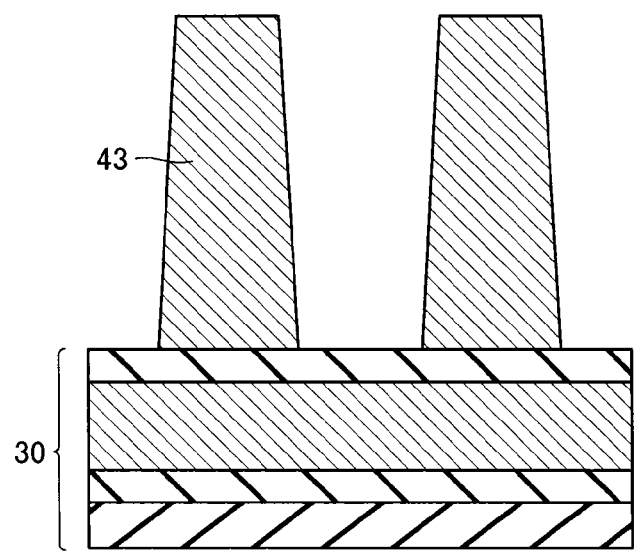
Figure 11:
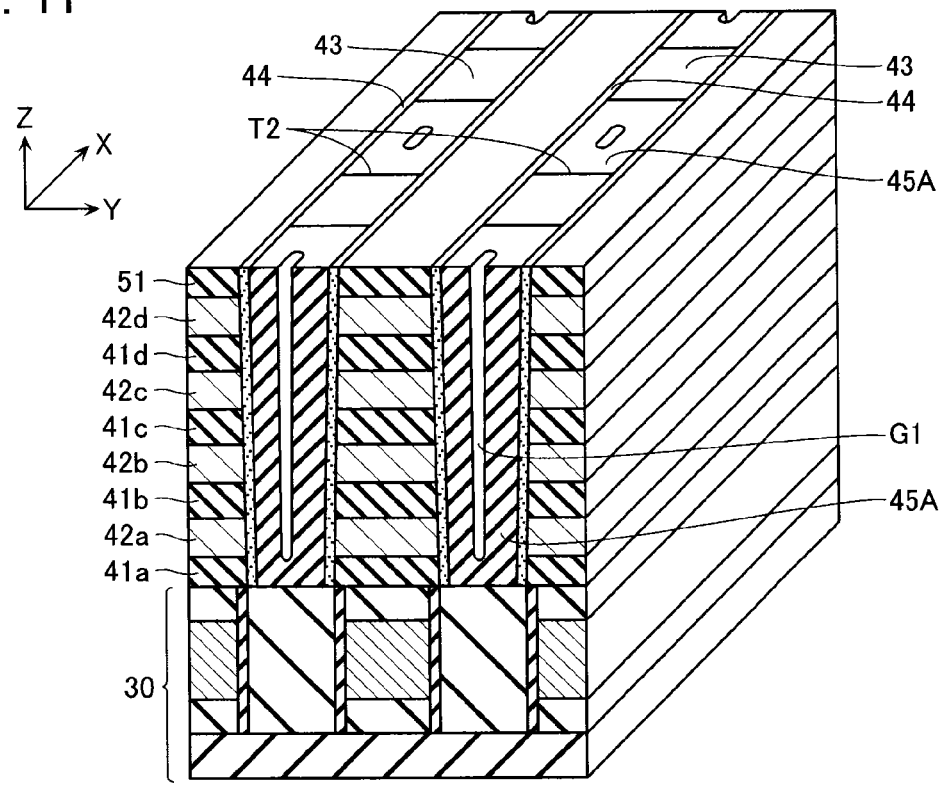
FIG. 11 is an example of a perspective view showing the manufacturing method of the memory cell array 11 according to the first embodiment.

As shown in FIG. 10A, RIE (reactive ion etching) is performed on the semiconductor layer 43' to form a trench T2 that penetrates the semiconductor layer 43'. The trenches T2 can be arranged with a certain pitch in the X direction by using lithography technology. The semiconductor layer 43' becomes the semiconductor layer 43 in this process and the semiconductor layer 43 may have a tapered shape as shown in FIG. 10B, when viewed in a plane along the line A-A (XZ plane). Then, as shown in FIG. 11, silicon oxide ($SiO_2$) is deposited in the trench T2 by a highly isotropic film formation method such as an ALD method or CVD method to form the interlayer insulating layer 45A in the trench T2. This interlayer insulating layer 45A does not completely fill the trench T2, and is formed so as to have an air gap G1 therein. Now, the interlayer insulating film 45A can be formed on a side surface of the trench T2 conformally. As a result, a lower end of the air gap G1 can be higher than an upper surface of the interlayer insulating film 38 (a lower surface of the interlayer insulating film 45) by an amount of a film thickness of the interlayer insulating film 45A, or can be higher than the interlayer insulating film 38 by slightly more than the amount of the film thickness of the interlayer insulating film 45A.

Note that the trenches T1 and T2 have a reverse tapered shape where an upper end is of broad width and a lower end is of narrow width, hence as mentioned earlier, the bit line BL, that is the conductive layer 43, has a reverse tapered shape in a ZY cross-section and has a forward tapered shape in an XZ cross-section.

Subsequently, heat processing of about 650° C. for three minutes is executed to release gas included in and around the interlayer insulating film 45A. Since the air gap G1 is formed in the interlayer insulating film 45A, generation of voids in the interlayer insulating film 45A is suppressed.

Due to the air gap G1 formed continuously in a stacking direction in the interlayer insulating film 45, gas generated from the interlayer insulating film 45A can be easily released to outside in the heat processing. As a result, generation of voids inside the interlayer insulating film 45A is suppressed. Generation of voids is a cause of trouble such as a pattern defect or an inter-line short-circuiting defect.

Figure 13:
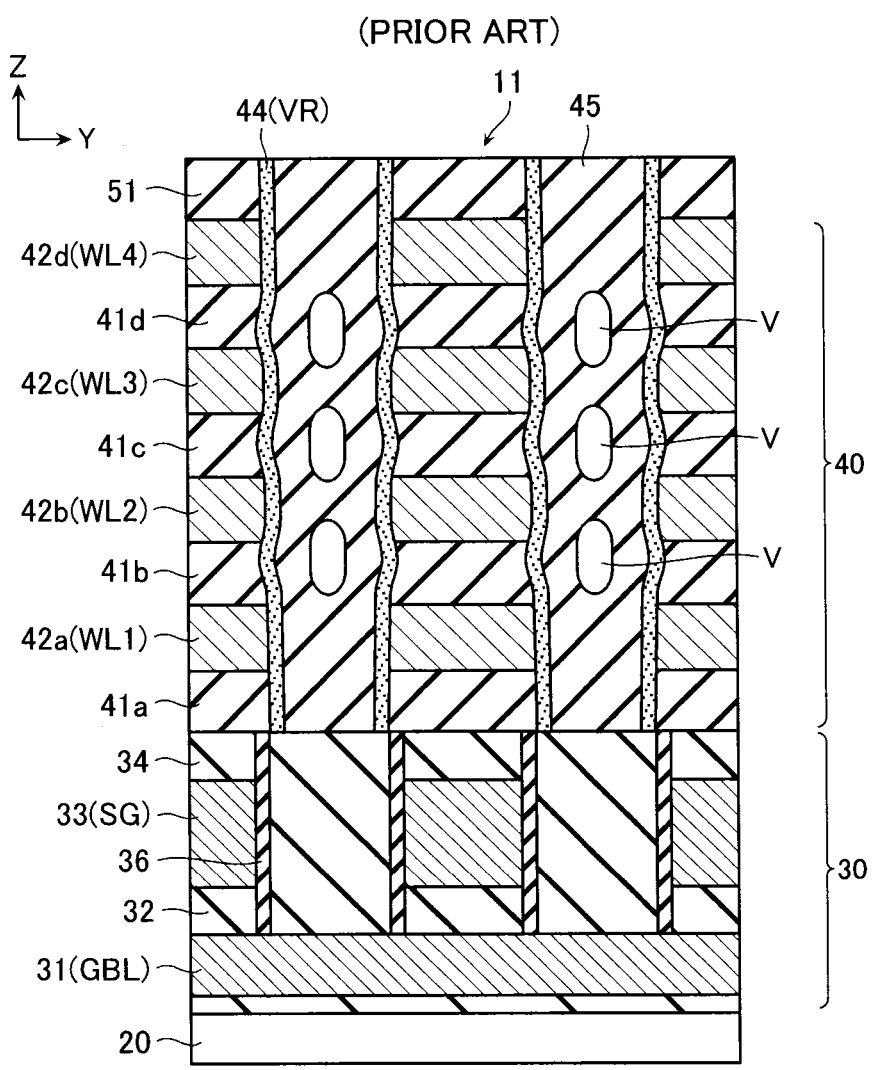
FIG. 13 is a cross-sectional view of a comparative example.

As shown in FIG. 13, let us suppose the case where there is no air gap in the interlayer insulating film 45 and silicon oxide is embedded so as to fill the entire trench T2. In this case, voids V may be generated by the heat processing and that reliability of the semiconductor memory device is lowered.

Due to the configuration of this embodiment, the interlayer insulating film 45 includes the air gap G1, hence even if the heat processing is implemented, generated gas is easily released to outside via the air gap G1, and the generation of voids is suppressed. Even assuming that voids are generated, a size of those voids is small and does not seriously affect reliability of the semiconductor memory device. Therefore, this embodiment makes it possible to provide a semiconductor memory device having high reliability of data holding characteristics, and so on.

Figure 12:
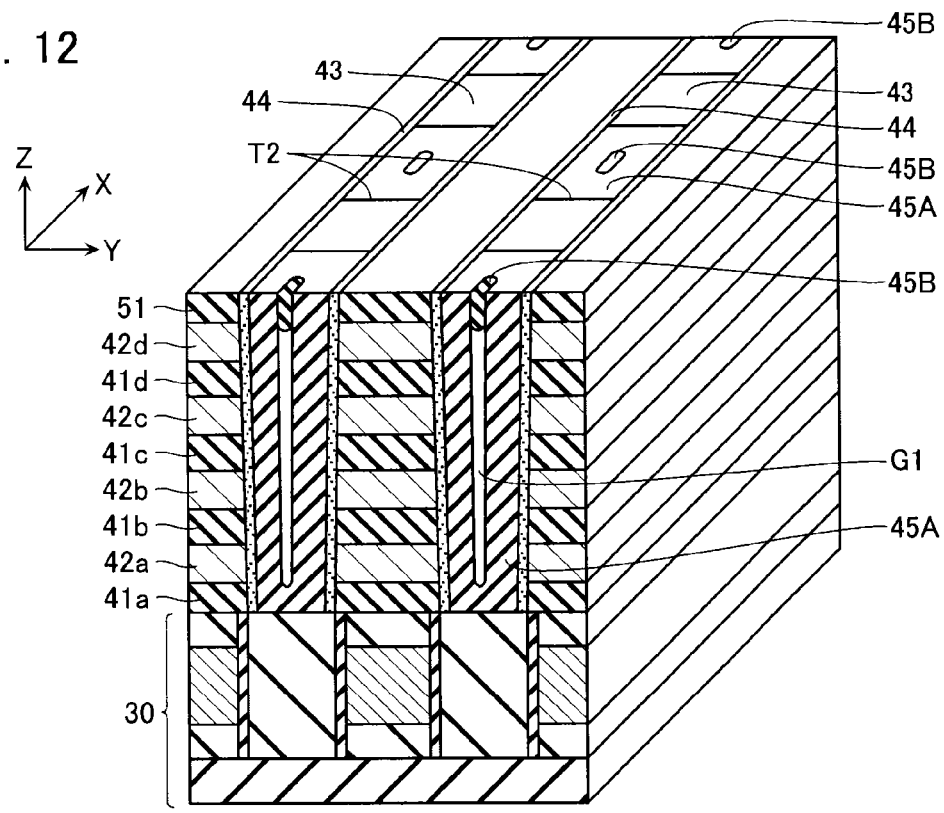
FIG. 12 is an example of a perspective view showing the manufacturing method of the memory cell array 11 according to the first embodiment.

Next, as shown in FIG. 12, CVD is executed so as to fill an upper portion of this air gap G1, thereby depositing an interlayer insulating film 45B that fills only the upper portion of the air gap G1. This interlayer insulating film 45B may be formed by the same material as the interlayer insulating film 45A, or may be formed by a different material. In the case of this interlayer insulating film 45B, it is preferable to adopt a film formation method of a lower isotropic nature than the film formation method of the interlayer insulating film 45A, such as sputtering film formation.

When voids V such as in FIG. 13 are formed, an upper surface of the void V may have a curved surface protruding upwardly in the Z direction. On the other hand, the upper surface of the air gap G1 has the interlayer insulating film 45B, and the upper surface of the air gap G1 is blocked by the interlayer insulating film 45B that includes a curved surface protruding downwardly. This is because whereas the air gap G1 has a shape that opens its upper surface in order to release gas, the interlayer insulating film 45B has a shape that blocks the upper surface.

Note that it is also possible to subsequently add a process that removes the insulating film 51 and an upper portion of the insulating film 45 to expose the upper surface of the conductive layer 42d.

[Second Embodiment]

Next, a semiconductor memory device according to a second embodiment will be described with reference to FIG. 14. An overall configuration of the semiconductor memory device of this second embodiment is identical to that of the first embodiment (FIGS. 1 to 3), moreover, a structure of the F4-F4 cross-section of FIG. 3 is also identical to that of the first embodiment (FIG. 4). However, in this embodiment, a structure of the F5-F5 cross-section of FIG. 3 is different from that of the first embodiment (FIG. 5).

Figure 14:
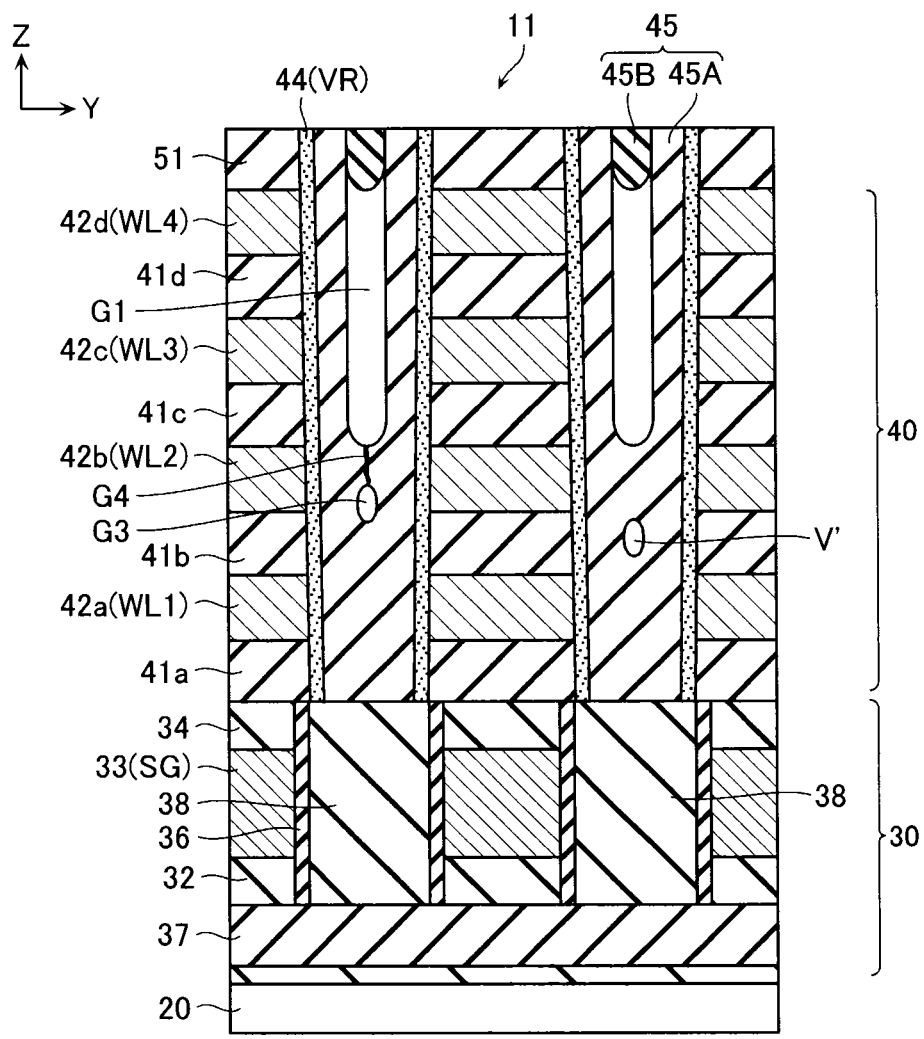
FIG. 14 is an example of a cross-sectional view taken along the line F5-F5 of FIG. 3, in a second embodiment.

That is, as shown in FIG. 14, in this second embodiment, the lower end of the air gap G1 is present in a midway vicinity of the trench T2 (in other words, this air gap G1 extends in the Z direction so as to intersect only some word lines WL in an upper side among the plurality of word lines WL (conductive layers 42a to 42d) aligned along the Z direction). That is, the lower end of the air gap G1 is higher than a lower surface of the lowest conductive layer 42a.

In the case where the position of the lower end of the air gap G1 is shallow as in this second embodiment, there is a possibility that a void V' shown in FIG. 14 as an example is formed below the lower end of the air gap G1. Moreover, if an upper portion of the void V' is linked to the lower end of the air gap G1 by a seam G4 or the like, then the void V' may also be regarded as a separate air gap G3 (second air gap) extending separated from the air gap G1.

However, if the lower end of the air gap G1 extends to about the midway of the trench T2 as in FIG. 14, then gas from the interlayer insulating film 45 below the air gap G1 can be released to a certain extent. Therefore, even assuming that a void V' is formed, a size and number of the voids is small. Hence, effects due to the voids (a short-circuiting defect, a pattern defect, and so on) are limited. Therefore, this second embodiment also allows identical advantages to those of the first embodiment to be displayed. That is, if the air gap G1 is formed above the void V', it may be said that advantages of the invention of the present application are achieved.

[Third Embodiment]

Next, a semiconductor memory device according to a third embodiment will be described with reference to FIG. 15. An overall configuration of the semiconductor memory device of this third embodiment is identical to that of the first embodiment (FIGS. 1 to 3), moreover, a structure of the F4-F4 cross-section of FIG. 3 is also identical to that of the first embodiment (FIG. 4). However, in this embodiment, a structure of the F5-F5 cross-section of FIG. 3 is different from that of the first embodiment (FIG. 5).

Figure 15:
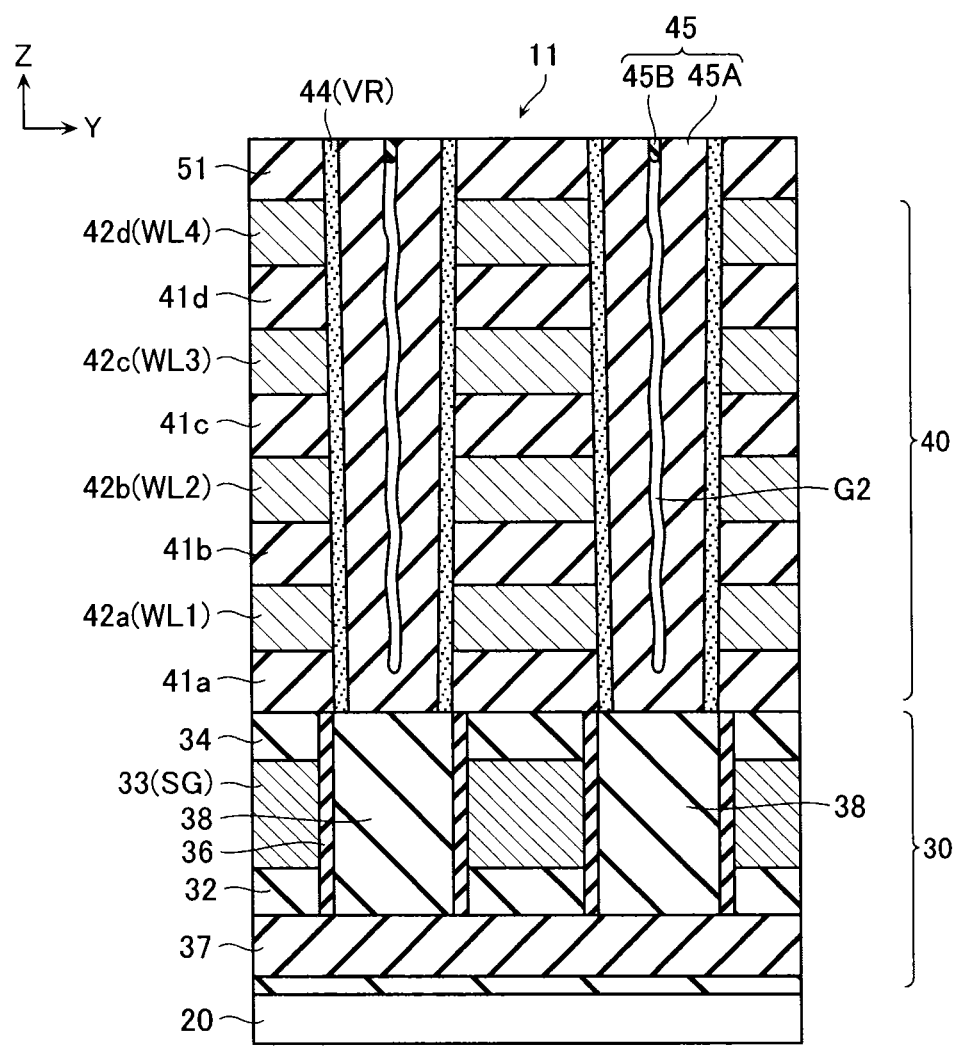
FIG. 15 is an example of a cross-sectional view taken along the line F5-F5 of FIG. 3, in a third embodiment.

That is, as shown in FIG. 15, this third embodiment differs from the previously described embodiments in that in this third embodiment, a "porous"-shaped air gap G2 having a width which is smaller than in the first embodiment is formed in the interlayer insulating film 45A. Even such a porous-shaped air gap G2 allows gas generated from the interlayer insulating film 45 to be released in the heat processing, and allows identical advantages to those of the first and second embodiments to be displayed. Moreover, the air gap G2 may be a seam. That is, it is only required to form a passage through which gas escapes upwardly of the interlayer insulating film 45.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 16:
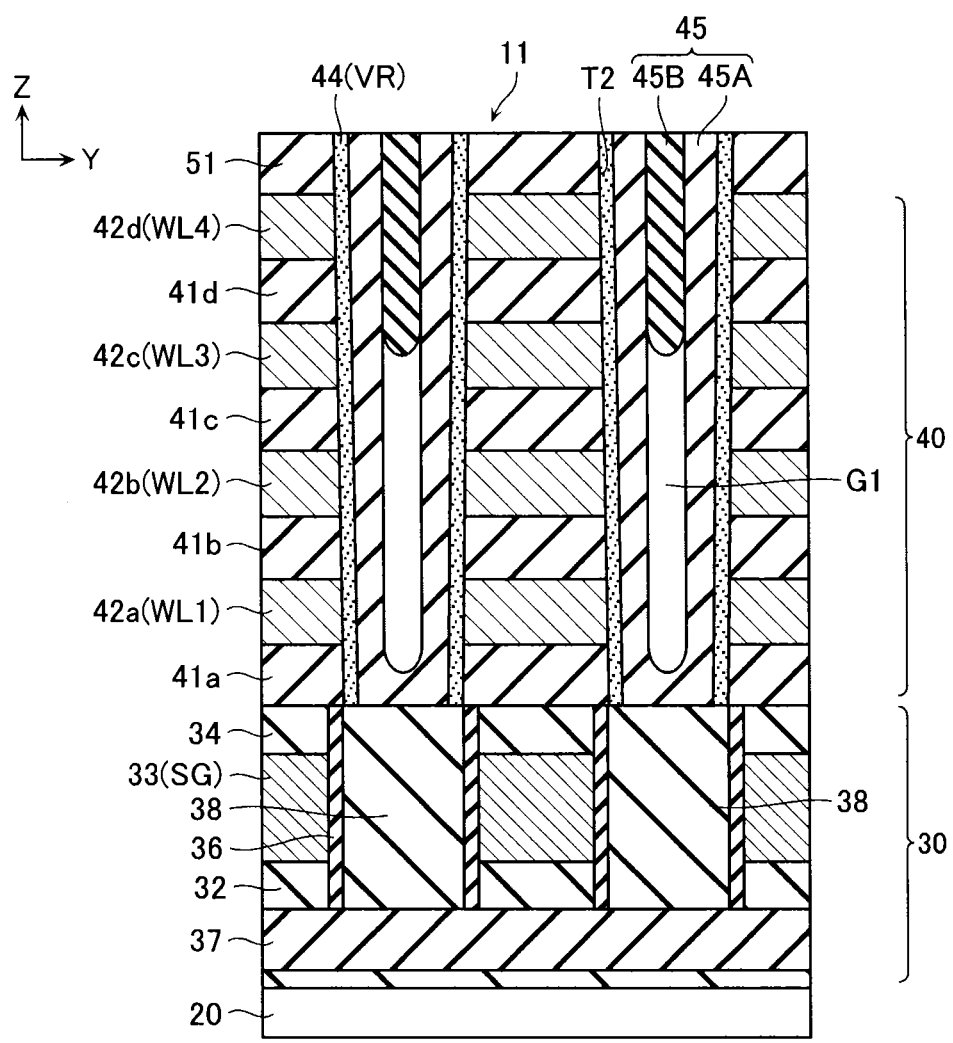
FIG. 16 is an example of a cross-sectional view showing a modified example.

For example, in the above-described embodiments, the interlayer insulating film 45B is formed so as to fill only the upper end of the air gap G1, but as shown in FIG. 16, may be formed not only at the upper end but also to a depth reaching to the second layer conductive layer 42c, for example. That is, it could be said that the lower surface of the interlayer insulating film 45B is at a position which is lower than the lower surface of the first-layer conductive layer 42d.

Figure 17:
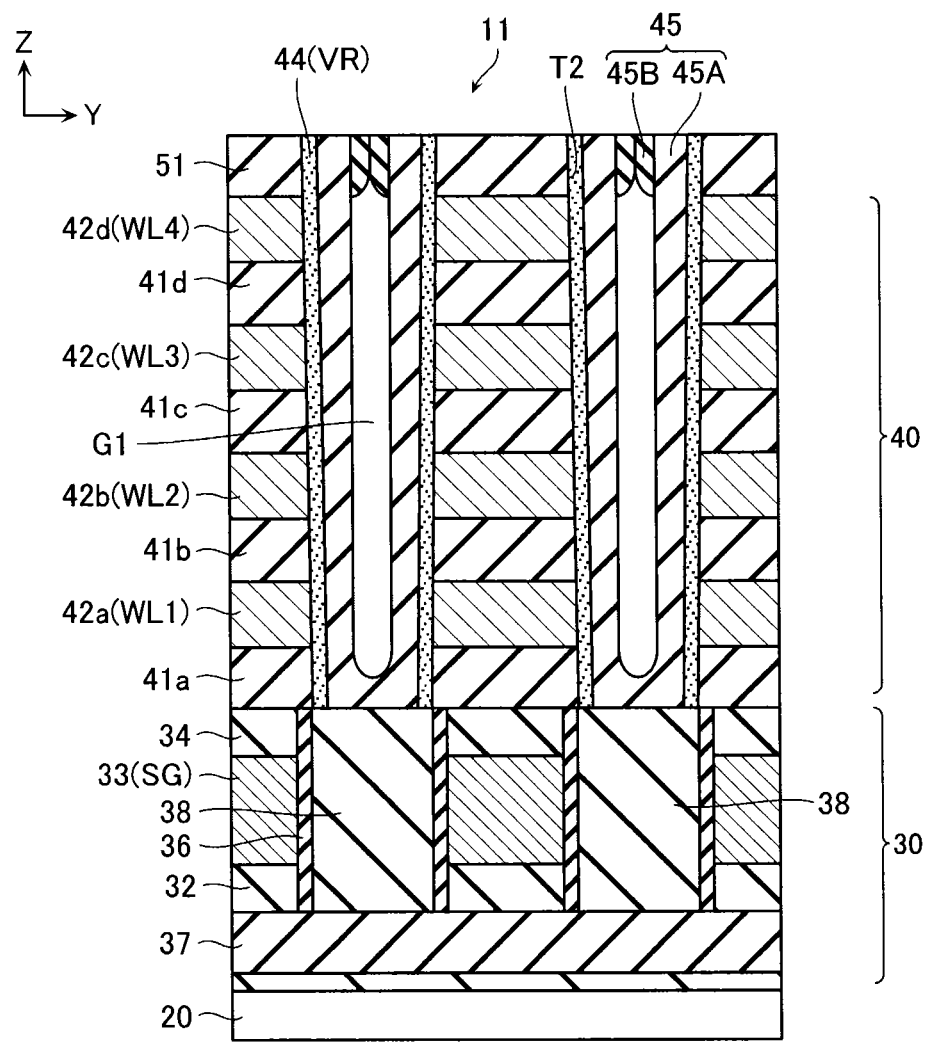
FIG. 17 is an example of a cross-sectional view showing another modified example.

Moreover, as shown in, for example, FIG. 17, the interlayer insulating film 45B may be configured from two interlayer insulating films 45Ba and 45Bb having curved surfaces that extend from both side surfaces of the air gap G1 upwardly in the Z direction. These two interlayer insulating films 45Ba and 45Bb may be configured in a shape where they meet at a central vicinity of the air gap G1. At this time, a height of a bottom surface of the interlayer insulating film 45B overall is formed highest at the central vicinity of the air gap G1.

Figure 18:
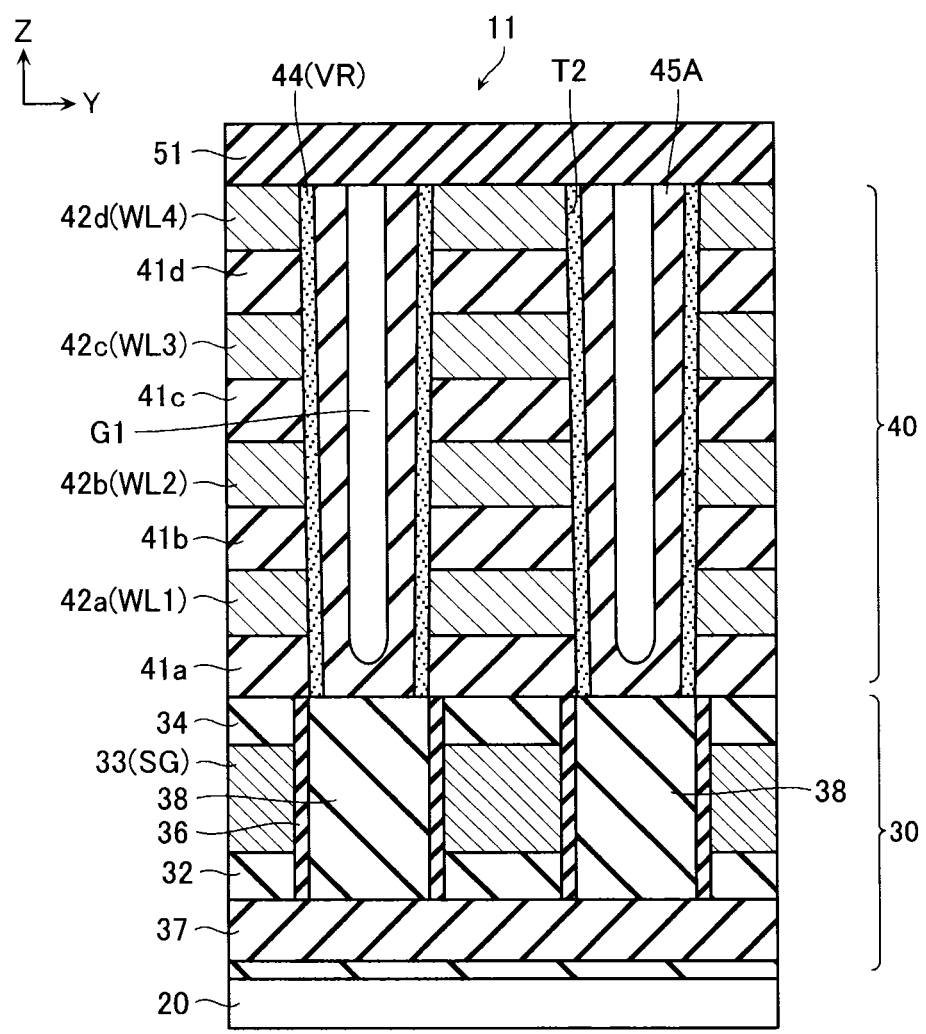
FIG. 18 is an example of a cross-sectional view showing yet another modified example.

In addition, as shown in, for example, FIG. 18, it is also possible for the interlayer insulating film 45B to be omitted. At this time, the insulating film 51 is formed on the conductive layer 42d and the air gap G1. As a result, the air gap G1 is blocked by the insulating film 51. Moreover, a bottom surface of the insulating film 51 at an upper surface of trench T2 is substantially flat.

What is claimed is:

1. A semiconductor memory device, comprising:
    first lines arranged in a first direction crossing a main surface of a substrate and extending in a second direction crossing the first direction;
    second lines arranged in the second direction, extending in the first direction, and intersecting the first lines;
    memory cells disposed at intersections of the first lines and the second lines; and
    an interlayer insulating film provided between the second lines arranged in the second direction,
    the interlayer insulating film having therein an air gap extending continuously in the first direction so as to intersect at least some of the first lines aligned along the first direction, and
    an insulating film positioned above the air gap and having a curved surface that protrudes toward a direction of the substrate, the air gap being positioned between the second lines arranged in the second direction.

2. The semiconductor memory device according to claim 1, wherein
    the air gap extends in the first direction so as to intersect all of the first lines aligned along the first direction.

3. The semiconductor memory device according to claim 1, wherein
    a lower end of the air gap is higher than a lower end of the interlayer insulating film by an amount of a film thickness of the interlayer insulating film.

4. The semiconductor memory device according to claim 1, wherein
    two or more of the air gaps are disposed, and
    the air gaps have a first air gap extending in the first direction so as to intersect some of the plurality of first lines aligned along the first direction; and a second air gap disposed below the first air gap.

5. The semiconductor memory device according to claim 1, wherein
    in a cross-section along the first direction and a third direction, the third direction being orthogonal to the first direction and the second direction, the second line has an inverse tapered shape,
    whereas in a cross-section along the first direction and the second direction, the second line has a forward tapered shape.

6. The semiconductor memory device according to claim 1, wherein
    the air gap is a porous-shaped air gap extending in the first direction.

7. The semiconductor memory device according to claim 1, wherein
    the curved surface of the insulating film has a shape extending from both side surfaces of the air gap and meets at a central vicinity of the air gap.

8. The semiconductor memory device according to claim 1, wherein
    the memory cells include a variable resistance layer disposed at intersections of the first lines and the second lines.

9. The semiconductor memory device according to claim 1, further comprising
    third lines extending in a third direction crossing the first direction, and
    selection transistors connected between the second lines and the third lines.

10. The semiconductor memory device according to claim 1, wherein the first direction is perpendicular to the main surface of the substrate.

11. A semiconductor memory device, comprising:
    first lines arranged in a first direction and extending in a second direction crossing the first direction;
    second lines arranged in the second direction, extending in the first direction, and intersecting the first lines;
    memory cells disposed at intersections of the first lines and the second lines; and
    an interlayer insulating film provided between the second lines,
    the interlayer insulating film extending in the first direction at a position between the second lines aligned along the second direction, and having therein an air gap extending continuously in the first direction so as to intersect at least some of the first lines aligned along the first direction, the air gap being positioned between the second lines arranged in the second direction.

12. The semiconductor memory device according to claim 11, wherein
    the air gap extends in the first direction so as to intersect all of the first lines aligned along the first direction.

13. The semiconductor memory device according to claim 11, wherein
    a lower end of the air gap is higher than a lower end of the interlayer insulating film by an amount of a film thickness of the interlayer insulating film.

14. The semiconductor memory device according to claim 11, wherein
    two or more of the air gaps are disposed, and
    the air gaps have a first air gap extending in the first direction so as to intersect some of the plurality of first lines aligned along the first direction; and a second air gap disposed below the first air gap.

15. The semiconductor memory device according to claim 11, wherein
    in a cross-section along the first direction and a third direction, the third direction being orthogonal to the first direction and the second direction, the second line has an inverse tapered shape,
    whereas in a cross-section along the first direction and the second direction, the second line has a forward tapered shape.

16. The semiconductor memory device according to claim 11, wherein
    the air gap is a porous-shaped air gap extending in the first direction.

17. The semiconductor memory device according to claim 11, wherein
    the interlayer insulating film includes a second insulating film formed above the air gap, and a lower surface of the second insulating film is flat at an upper surface of the air gap.

18. The semiconductor memory device according to claim 11, wherein
    the memory cells include a variable resistance layer disposed at intersections of the first lines and the second lines.

19. The semiconductor memory device according to claim 11, further comprising
    third lines extending in a third direction crossing the first direction, and
    selection transistors connected between the second lines and the third lines.

20. The semiconductor memory device according to claim 11, further comprising a substrate having a main surface, wherein the first direction is perpendicular to the main surface of the substrate.

* * * * *